United States Patent [19]

Yee et al.

[11] Patent Number: 5,638,529
[45] Date of Patent: Jun. 10, 1997

[54] VARIABLE REFRESH INTERVALS FOR SYSTEM DEVICES INCLUDING SETTING THE REFRESH INTERVAL TO ZERO

[75] Inventors: Dawson L. Yee, Beaverton; Thomas A. Rampone, Hillsboro, both of Oreg.

[73] Assignee: Intel Corporation, Santa Clara, Calif.

[21] Appl. No.: 391,078

[22] Filed: Feb. 17, 1995

Related U.S. Application Data

[63] Continuation of Ser. No. 934,774, Aug. 24, 1992, abandoned.

[51] Int. Cl.$^6$ .................................................. G06F 12/16
[52] U.S. Cl. ........................................................ 395/433
[58] Field of Search ............................ 395/433; 365/222

[56] References Cited

U.S. PATENT DOCUMENTS

| | | | |
|---|---|---|---|
| 3,800,295 | 3/1974 | Anderson, Jr. et al. | 365/222 |
| 4,716,551 | 12/1987 | Inagaki | 365/222 |
| 5,033,027 | 7/1991 | Amin | 365/222 |
| 5,193,165 | 3/1993 | Eikill et al. | 395/433 |
| 5,241,642 | 8/1993 | Norsworthy et al. | 395/164 |
| 5,345,574 | 9/1994 | Sakurada et al. | 395/442 |
| 5,379,400 | 1/1995 | Barakat et al. | 395/433 |
| 5,511,176 | 4/1996 | Tsuha | 395/433 |

OTHER PUBLICATIONS

–82359 Dram Controller, *82350DT EISA Chip Set Handbook*, Intel Corporation, pp. 504–674 (Apr. 1991).

*Primary Examiner*—Eddie P. Chan
*Assistant Examiner*—Reginald G. Bragdon
*Attorney, Agent, or Firm*—Blakely, Sokoloff, Taylor & Zafman

[57] ABSTRACT

An apparatus is provided for controlling a memory refresh operation in a computer system having a processor coupled to a host volatile memory via a memory controller, a system bus controller coupled to the processor via the memory controller, and a plurality of devices coupled to the system bus controller via a system bus. The apparatus includes a first timer coupled to the memory controller for generating a first memory refresh signal at a first predetermined time interval to cause the memory controller to perform the memory refresh operation on the host volatile memory. A second timer is coupled to the system bus controller for generating a second memory refresh signal at a selective time interval to causes the system bus controller to perform the memory refresh operation on the plurality of devices. A program is provided for detecting the refresh requirement of the plurality of devices in order to determine the selective time interval. When the program detects that one of the plurality of devices requires the memory refresh operation, the program sets the selective time interval to a second predetermined time interval. When the program detects that none of the plurality of devices requires the memory refresh operation, the program switches off the second timer. A method of controlling the memory refresh operation is also described.

20 Claims, 4 Drawing Sheets

VARIABLE REFRESH INTERVALS FOR SYSTEM DEVICES INCLUDING SETTING THE REFRESH INTERVAL TO ZERO

This is a continuation of application Ser. No. 07/934,774, filed Aug. 24, 1992, now abandoned.

The present invention pertains to the field of computer systems. More particularly, this invention relates to a computer system having volatile memories and reduced memory refresh.

BACKGROUND OF THE INVENTION

A prior microprocessor based computer system typically includes memories in order to store instructions and/or data for processing. The memories typically include volatile memories. The content stored in a prior volatile memory is typically lost if the power supply to the prior computer system is disrupted. One type of prior volatile memories is a dynamic random access memory ("DRAM"). A prior DRAM typically includes a plurality of DRAM cells, each storing one bit of data. The information is typically stored in a prior DRAM cell in the form of electrical charge. When the charge stored in a DRAM cell is less than a certain voltage level (e.g., 0.5 volts), it indicates a logical zero value, for example. When the charge stored in that particular DRAM cell is greater than a certain voltage level (e.g., 1.8 volts), it indicates a logical one value, for example.

A prior DRAM cell typically loses its electrical charge over a period of time, which may result in the logical content of the cell charging. Therefore, it is necessary to refresh the prior DRAM cell. The refresh of a prior DRAM cell typically involves the steps of reading out the content stored in that cell and then writing it back to that cell. During the writing back step of the refresh operation, the cell will be charged above the voltage level representing the content stored.

The refresh operation is typically periodically performed to the prior DRAM. A refresh timer is typically provided in the prior computer system to periodically trigger the refresh operation. One prior arrangement of using a refresh timer to periodically activate the refresh operation is illustrated in FIG. 1.

Referring to FIG. 1, a prior computer system 10 is shown which includes a CPU 11 coupled to a host bus 12 via line 11a. A DRAM 14 is also coupled to host bus 12 via line 14a and to a system bus 18 via fine 14b. DRAM 14 is controlled by a DRAM controller 13. System bus 18 is also connected to a plurality of system devices 20a through 20n. System devices 20a–20n may typically include at least one volatile memory. The bus activities of system bus 18 is controlled by a system bus controller 15. System bus controller 15 is also coupled to DRAM controller 13.

A refresh timer 16 is provided in computer system 10. Refresh timer 16 is coupled to system bus controller 15 via line 17a and to DRAM controller 13 via line 17b. Refresh timer 16 is set to generate a refresh signal to DRAM controller 13 via line 17b and to system bus controller 15 via line 17a at every 15 microseconds. DRAM controller 13 then performs a memory refresh operation to DRAM 14 and system bus controller 15 performs the refresh operation to the system devices that require the refresh. The refresh operation typically takes one microsecond to finish. During the refresh operation, CPU 11 and system bus 18 are both held non-operational. This arrangement is typically referred to as "coupled refresh."

One disadvantage of this prior arrangement is that CPU 11 is held off and no bus activity can occur on system bus 18 during the memory refresh operation. CPU 11 cannot access any of the system devices 20a through 20n that does not require the memory refresh operation. In other words, computer system 10 is not operative for 1 microsecond at every 15 microseconds.

A prior improvement of the above-described prior arrangement is illustrated in FIG. 2. In FIG. 2, computer system 30 includes a DRAM refresh timer 36 coupled to a DRAM controller 33, and a system refresh timer 37 coupled to a system bus controller 35. DRAM refresh timer 36 generates a memory refresh signal to DRAM controller 33 at a predetermined time interval. The predetermined time interval is typically 15 microseconds. Upon receiving the memory refresh signal, DRAM controller 33 then performs the memory refresh operation to DRAM 34. System refresh timer 37 generates a system memory refresh signal to system bus controller 35 at another predetermined time interval which can also typically be 15 microseconds. System refresh timer 37 generates its system memory refresh signal independent of the generation of the memory refresh signal from DRAM refresh timer 36. Upon receiving the system memory refresh signal, system bus controller 35 starts to perform the memory refresh operation to system devices 40a–40n, regardless of whether there is a system volatile memory among system devices 40a–40n. In addition, system bus controller 35 refreshes system devices 40a–40n independent of the occurrence of the DRAM refresh operation to DRAM 34. In other words, the system memory refresh operation is asynchronously performed with the DRAM refresh operation. In this case, CPU 31 may not necessarily be held off in refresh state during the memory refresh of DRAM 34 and may access system devices 40a–40n. Moreover, CPU 31 may access DRAM 34 when system bus controller 35 is performing the memory refresh operation to system devices 40a–40n.

One disadvantage of this prior arrangement is that the CPU access to the system bus is restricted when the system bus controller is performing the system memory refresh operation. Whenever the system bus controller is performing the refresh operation, the CPU cannot access any of the system devices that does not require the memory refresh operation via the system bus. In this case, the CPU resource is still wasted. Another disadvantage is that the memory refresh operation is performed regardless whether there is a volatile memory among system devices 40a–40n.

SUMMARY AND OBJECTS OF THE INVENTION

One of the objects of the present invention is to increase the system performance of a computer system.

Another object of the present invention is to provide a computer system with reduced memory refresh frequency.

Another object of the present invention is to provide a scheme that selects the memory refresh frequency for the computer system such that the system performance is maximized.

An apparatus for controlling a memory refresh operation in a computer system is described. The computer system includes a processor coupled to a host volatile memory via a memory controller, a system bus controller coupled to the memory controller and the processor via the memory controller, and a plurality of devices coupled to the system bus controller via a system bus. The apparatus includes a first timer coupled to the memory controller for generating a first memory refresh signal at a first predetermined time interval. The memory controller performs the refresh operation to the host volatile memory upon receiving the first memory refresh signal. A second timer is coupled to the system bus controller for generating a second memory refresh signal at a second selective time interval to the system bus controller. The system bus controller performs the refresh operation to the plurality of devices upon receiving the second memory refresh signal. The system bus controller performs the refresh operation to the plurality of devices independent of the first memory refresh signal. A program is provided for determining the second selective time interval of the second memory refresh signal for the second timer. When the program detects that one of the plurality of devices requires the memory refresh operation, the program then sets the second selective time interval to a second predetermined time interval. When the program detects that none of the plurality of devices requires the memory refresh operation, then the program sets the second selective time interval to a third predetermined time interval the effect of which is equal to switching off the second timer.

A method of controlling the memory refresh operation in the above described computer system is also described. The method includes the steps of:

(a) causing a first timer to generate a first memory refresh signal at a first predetermined time interval to the memory controller, wherein the first timer is coupled to the memory controller, wherein the memory controller performs the memory refresh operation to the host volatile memory upon receiving the first memory refresh signal;

(b) determining by a program if at least one of the plurality of devices requires the memory refresh operation;

(c) if at least one of the plurality of devices is determined to require the memory refresh operation, then causing a second timer to generate a second memory refresh signal at a second predetermined time interval, wherein the second timer is coupled to the system bus controller, wherein the second predetermined time interval is set in the second timer by the program, wherein the system bus controller performs the memory refresh operation to the one of the plurality of devices upon receiving the second memory refresh signal, wherein the system bus controller performs the memory refresh operation to the one of the plurality of devices independent of the first memory refresh signal; and (d) if none of the plurality of devices is determined to require the memory refresh operation, then setting in the second timer a third predetermined time interval the effect of which is equal to switching off the second timer means.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
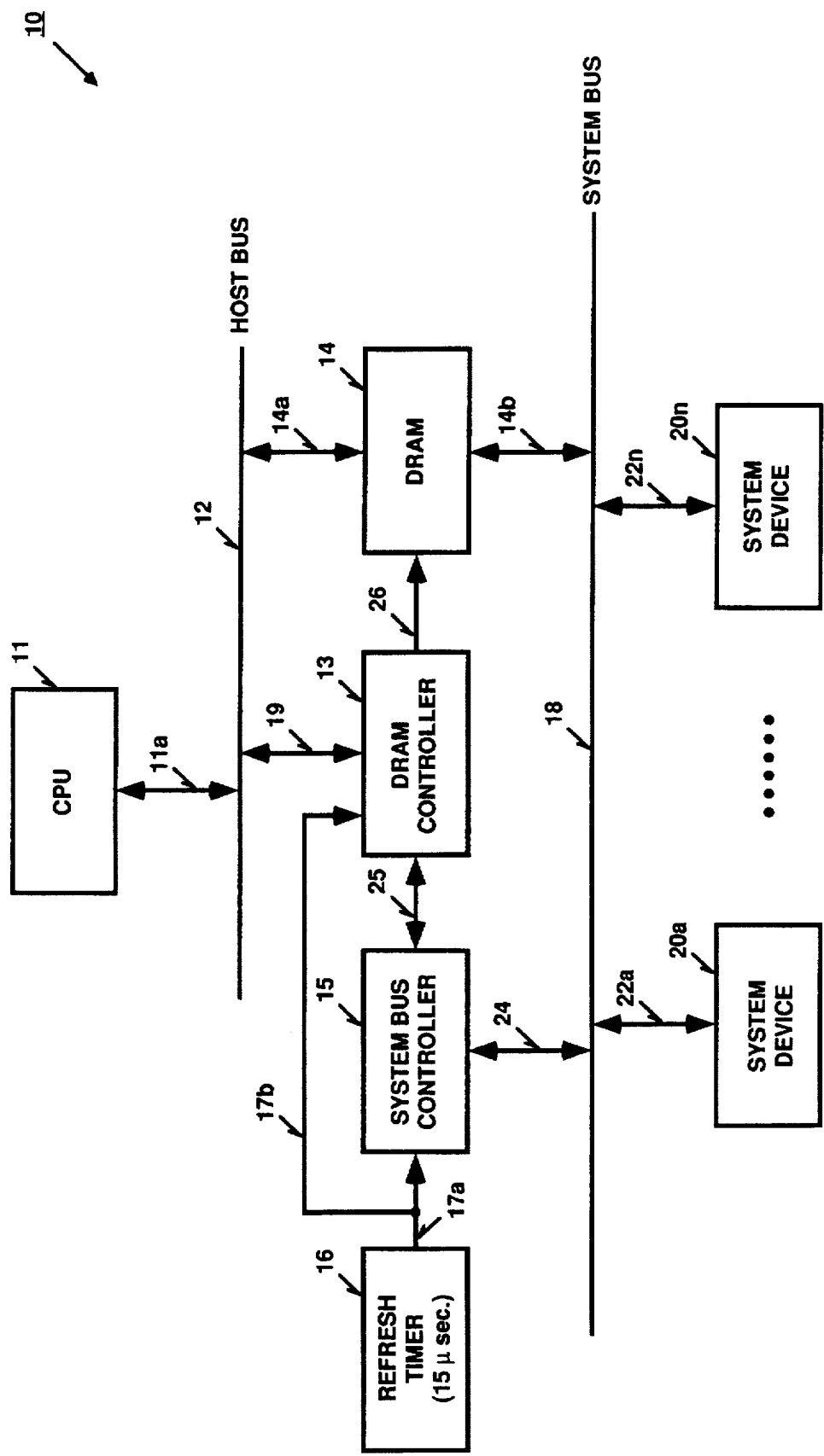
FIG. 1 is a block diagram of a computer system with a prior art memory refresh arrangement.
Figure 2:
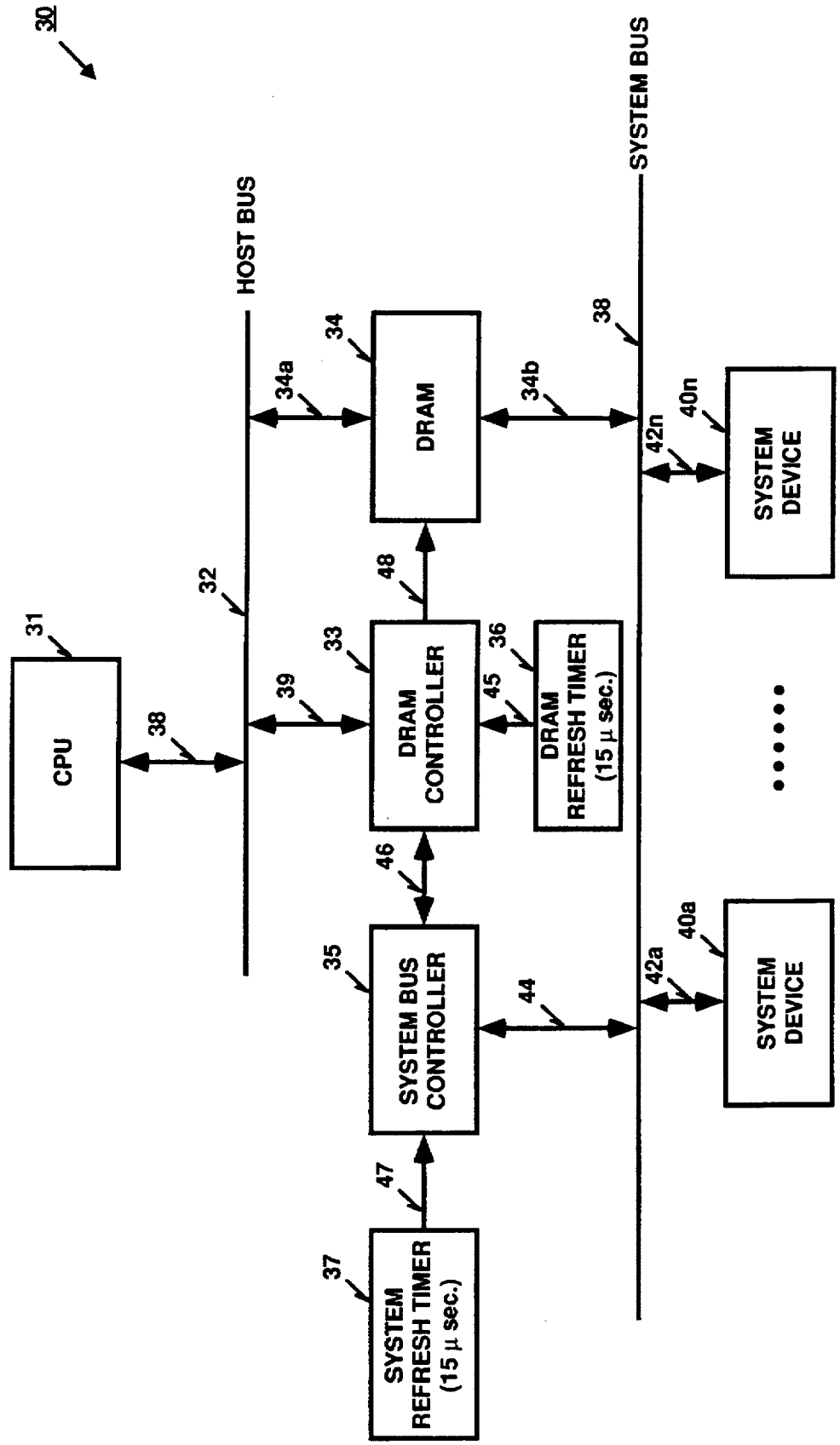
FIG. 2 is a block diagram of a computer system with another prior art memory refresh arrangement.
Figure 3:
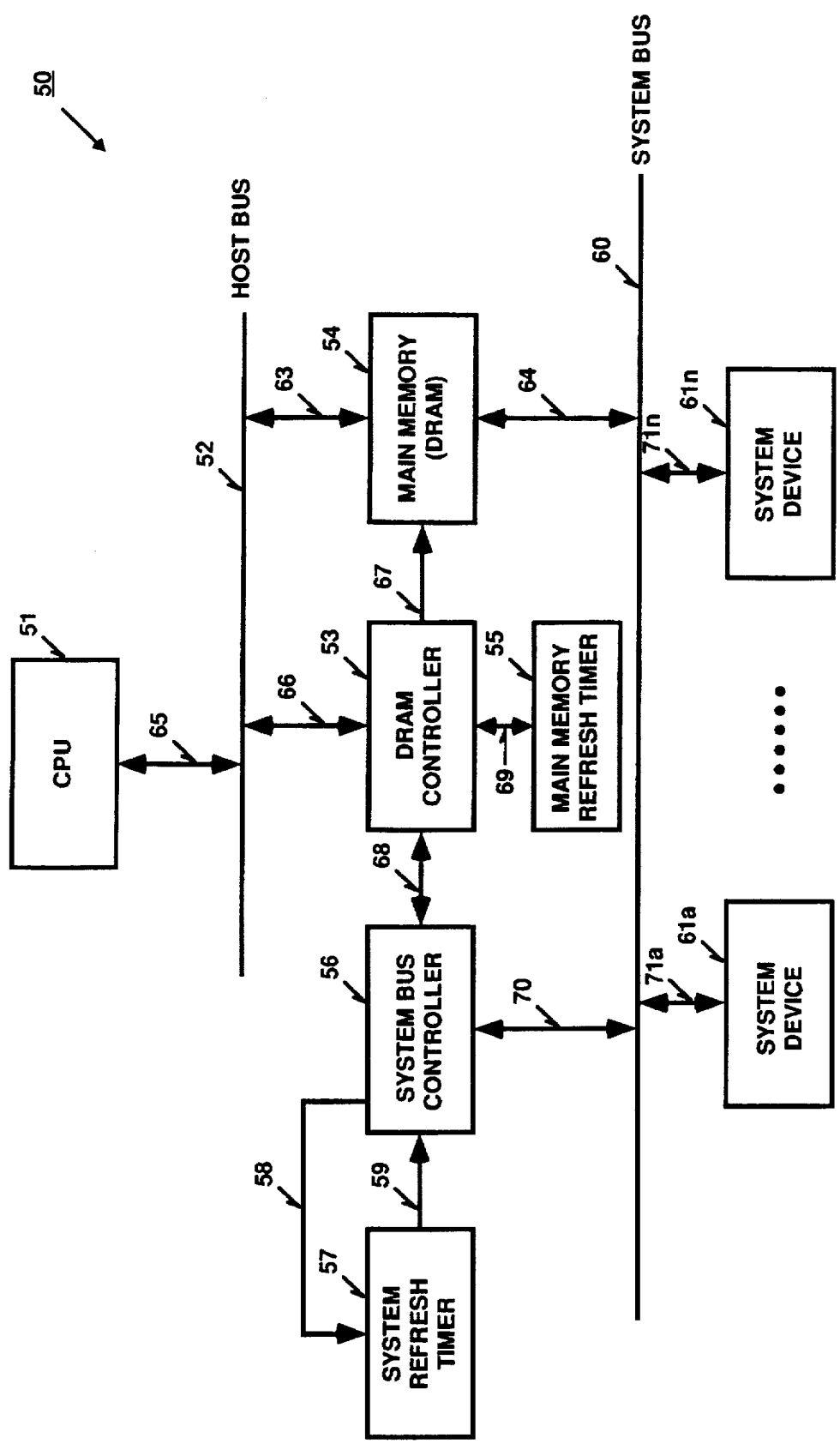
FIG. 3 is a block diagram of a computer system with a memory refresh arrangement in accordance with the present invention.

FIG. 3 illustrates in block diagram form an architecture of a microprocessor based computer system 50, which implements a preferred embodiment of the present invention. FIG. 3 shows one configuration of computer system 50.

As will be described in more detail below, computer system 50 includes a microprocessor coupled to a main volatile memory via a memory controller, a system bus controller coupled to the microprocessor and the memory controller, and a plurality of system devices coupled to the system bus controller via a system bus. A main memory refresh timer is coupled to the memory controller. The main memory refresh timer generates a main memory refresh signal to the memory controller at a first predetermined time interval. The memory controller performs the memory refresh operation to the main volatile memory upon receiving the main memory refresh signal. A system memory refresh timer is coupled to the system bus controller. The system memory refresh timer generates a system memory refresh signal at a second selective time interval. The system bus controller performs the memory refresh operation to the system devices that require the memory refresh operation upon receiving the system memory refresh signal. The system bus controller performs the memory refresh operation to the system devices via the system bus and independent of the occurrence of the main memory refresh signal. A program is provided in the computer system for determining the second selective time interval of the system memory refresh timer. When the program detects that at least one of the system devices requires the memory refresh operation, the program then sets the second selective time interval to a second predetermined time interval. When the program detects that none of the system devices requires the memory refresh operation, then the program sets the second selective time interval to a third predetermined time interval whose effect is equivalent to switching off the system memory refresh timer. The program can be running on the microprocessor or on the system bus controller:

Referring to FIG. 3, computer system 50 includes a host bus 52 connected to a central processing unit ("CPU") 51. CPU 51 typically comprises a microprocessor and a cache connected to the microprocessor. In one embodiment, CPU 51 includes a microprocessor, a co-processor, a cache, and a cache controller for handling access to the cache by the microprocessor. In a further embodiment, the elements mentioned above may reside on a single semiconductor substrate. In other embodiments, more or fewer than the elements mentioned above may be included in CPU 51.

In one embodiment, CPU 51 comprises an 80386 microprocessor (i.e., i386™ CPU) manufactured by Intel Corporation. In this case, CPU 51 also comprises an 80387 (i.e., 387™) co-processor and an 82385 cache controller, both manufactured by Intel Corporation. In another embodiment, CPU 51 comprises an 80486 microprocessor (i.e., i486™ CPU) also manufactured by Intel Corporation.

Computer system 50 also includes a main memory 54 and a memory controller 53. In the presently preferred embodiment, main memory 54 contains a DRAM array. Therefore, memory controller 53 is a DRAM controller. In alternative embodiments, main memory 54 may be other types of volatile memories. In alternative embodiments, main memory 54 may comprise more than one DRAM array.

Memory controller 53 controls access to main memory 54 via line 67. CPU 51 therefore can access main memory 54 via host bus 52 and via memory controller 53. The data read from main memory 54 can be forwarded to CPU 51 via line 63 and host bus 52. In the presently preferred embodiment, memory controller 53 is a dual ported memory controller, which will be described in more detail below. In one embodiment, memory controller 53 is the 82359 DRAM controller.

Computer system 50 also includes a system bus 60 and a system bus controller 56. System bus controller 56 is coupled to system bus 60 via line 70 to control the activities on system bus 60. System bus controller 56 is also coupled to memory controller 53 via line 68.

In the presently preferred embodiment, computer system 50 employs an Extended Industry Standard Architecture ("EISA"). The EISA architecture is a high performance 32 bit architecture based on an Industry Standard Architecture ("ISA"). In alternative embodiments, computer system 50 can be any other types of computer systems.

In one embodiment, computer system 50 includes an 82350DT EISA chip set manufactured by Intel Corporation of Santa Clara, Calif. The 82350DT chip set integrates a complete EISA system into several VLSI components. The 82350DT chip set supports both i386™ and i486™ microprocessors. The 82350DT chip set also supports a decoupled memory refresh operation, which will be described in detail below. The 82350DT chip set comprises an 82358DT EISA bus controller, an 82357 integrated system peripheral, an 82352 EISA bus buffer, an 82359 DRAM controller, an 82353 advance data path, and an 82351 local I/O EISA support peripheral, all manufactured by Intel Corporation. In another embodiment, computer system 50 includes an 82350 EISA chip set.

In the presently preferred embodiment, system bus 60 is an EISA bus (i.e., Extended ISA bus). An ISA bus is a type of bus used in the ISA compatible computers. The EISA bus is a superset of the ISA bus.

System bus 60 is also connected to a plurality of system devices 61a through 61n. System devices 61a–61n each can be a system master or a system slave. When one of system device 61a–61n uses the EISA signal set to generate memory or I/O cycles, the device is referred to as a system master. When one of system devices 61a–61n uses the EISA signal set to accept cycles from various masters, it is referred to as a system slave. A system slave accepts cycles (i.e., operations) from various masters and returns information about its device type and data width. A system master generates memory or I/O cycles.

System bus controller 56 controls system masters of system devices 61a–61n to access main memory 54 via memory controller 53. System bus controller 56 also acts as gateway for CPU accesses to system devices 61a–61n via memory controller 53. In one embodiment, system bus controller 56 is the 82358DT EISA bus controller.

As mentioned above, memory controller 53 is a dual ported memory controller. Memory controller 53 includes two ports (i.e., address gateways). One port is connected to CPU 51 via host bus 52. This port (hereinafter referred to as "host port") is exclusively used by CPU 51, which provides a path for CPU 51 to main memory 54 or to system bus 60 via system bus controller 56.

The other port of memory controller 53 is connected to system bus 60 via system bus controller 56. This port (hereinafter referred to as "system port") of memory controller 53 is exclusively used by system devices 61a–61n, and acts as the gateway to and from system bus 60.

The host port of memory controller 53 is capable of accepting a host address and host cycle definition. From the address and cycle definition, memory controller 53 determines if the cycle is bound for main memory 54 or not. If the cycle is bound for main memory 54, memory controller 53 executes a memory access cycle. If the cycle is not bound for main memory 54, memory controller 53 forwards the cycle to system bus controller 56. The system port is capable of sending as well as receiving address and system bus cycle definitions. The system port accepts system bus cycles and decides if the system cycle is for main memory 54 or not. If the system cycle includes an address for a memory access to a location in main memory 54, memory controller 53 executes a memory cycle (e.g., DRAM cycle). If the address of the system cycle is not contained in main memory 54, no action is taken by memory controller 53.

When memory controller 53 receives addresses and cycle definitions from host bus 52 and system bus 60 at the same time, memory controller 53 then arbitrates the requirements and executes the cycle of the arbitration winner.

The dual ported architecture of memory controller 53 allows the CPU activity to be isolated from the system bus activity. This allows CPU 51 to execute out of main memory 54 at the same time the system bus activity is occurring. This design reduces CPU access time to main memory 54 significantly. This dual ported architecture of memory controller 53 provides routes which a cycle may follow: (1) CPU 51 to main memory 54; (2) CPU 51 to a system slave; (3) system master to main memory 54. System bus 56 provides a route for system masters to system slaves. The system slaves include local nonmemory devices (e.g., local I/O).

When CPU 51 decides to access a system slave, CPU 51 generates a host-to-system cycle in which control signal and an address are sent to memory controller 53. Memory controller 53 executes the cycle by passing the signals and the address to system bus controller 56. System bus controller 56 then converts the signals into its system protocol. In the presently preferred embodiment, system controller 56 converts the signals into EISA specific protocol.

Memory controller 53 periodically performs a main memory refresh operation to main memory 54 in order to preserve the data stored in main memory 54. This is due to the fact that main memory 54 comprises volatile memory (e.g., DRAM). Memory controller 53 is responsible for activating and controlling the refresh operation to main memory 54 during the main memory refresh operation. When the main memory refresh is needed, memory controller 53 causes main memory 54 to be arbitrated away from the current owner. Memory controller 53 could then cause the current owner to be held off in wait states while the main memory refresh occurs. The main memory refresh operation and the triggering of the main memory refresh operation will be described in more detail below.

In one embodiment, CPU 51 is not held off during the main memory refresh operation and can access its cache. In this embodiment, CPU 51 may also access system bus 60 via memory controller 53 during the main memory refresh operation. In another embodiment, CPU 51 is held off during the main memory refresh operation. In one embodiment, the main memory refresh operation takes approximately one microsecond to complete. In alternative embodiments, the main memory refresh operation may take more or fewer than one microsecond to complete.

System devices 61a through 61 n may comprise volatile memories. In one embodiment, system devices 61a–61h comprise at least one volatile memory. The volatile memory may be DRAM. In another embodiment, system devices 61a–61n do not comprise any volatile memory. Because system devices 61a–61n may comprise volatile memories, computer system 50 is also equipped with a system memory refresh operation, during which any volatile memories of system devices 61a–61n are refreshed. The system memory refresh operation is activated and controlled by system bus controller 56. When the system memory refresh is needed, system bus controller 56 could cause bus activity on system bus 60 to be held off in wait states while the system memory refresh occurs. During the system memory refresh operation, CPU 51 can access main memory 54 if it is not also held off in the refresh state. In one embodiment, the system memory refresh operation takes approximately one microsecond to complete. In alternative embodiments, the system memory refresh operation can be more or fewer than one microsecond.

In one embodiment, the system memory refresh operation is performed at the same time when the main memory refresh operation is performed. In another embodiment, the system memory refresh operation is asynchronously performed with respect to the main memory refresh operation. In a further embodiment, the system memory refresh operation is not performed. In this case, system devices 61a–61n do not have any volatile memory.

Computer system 50 includes a main memory refresh timer 55 coupled to memory controller 53 via line 69 in order to periodically trigger the main memory refresh operation. Main memory refresh timer 55 specifies a time interval at the end of which the main memory refresh operation is triggered. Computer system 50 also includes a system refresh timer 57 coupled to system bus controller 56 via lines 58 and 59 in order to periodically trigger the system memory refresh operation. System refresh timer 57 specifies a system refresh time interval at the end of which the system memory refresh operation is triggered. In addition, system refresh timer 57 can also be turned off. When system refresh timer 57 is switched off, the refresh time interval specified by system refresh timer 57 is equivalent to infinity. In other words, the refresh time interval specified by system refresh timer 57 is selective.

Main memory refresh timer 55 stores the main memory refresh time interval. At the end the main memory refresh time interval, main memory refresh timer 55 generates a main memory refresh signal to memory controller 53 via line 69 to cause memory controller 53 to activate the main memory refresh operation for main memory 54. Upon issuing the refresh signal to memory controller 53, main memory refresh timer 55 then resets the time interval and starts to count again. Therefore, refresh timer 55 periodically generates the refresh signal at the refresh time interval. The refresh time interval of main memory refresh timer 55 is determined in accordance with and can be adjusted to the memory refresh requirements of main memory 54 and the system architecture of computer system 50. It is to be noted that the main memory refresh signal generated by main memory refresh timer 55 only triggers memory controller 53 to perform the main memory refresh operation. This signal, however, does not cause system bus controller 56 to perform the system memory refresh operation. In one embodiment, the refresh time interval is set to be 15 microseconds. In alternative embodiments, the refresh time interval for refresh timer 55 may be longer or shorter than 15 microseconds.

Computer system 50 also includes a program subroutine running either on CPU 51 or memory controller 53. The program subroutine determines and sets the main memory refresh time interval in refresh timer 55 in accordance with the memory refresh requirements of main memory 54 and the system architecture of computer system 50. In one embodiment, the program subroutine is run on CPU 51. In another embodiment, the program subroutine is run on memory controller 53. The subroutine typically includes the steps of receiving the memory refresh requirements of main memory 54, determining the appropriated refresh time interval in accordance with the requirements received, and setting the determined refresh time interval in main memory refresh timer 55 via memory controller 53.

Alternatively, the refresh time interval can be programmed to main memory refresh timer 55 by a user. In this case, the user determines the refresh timer interval and manually programs it into timer 55.

System refresh timer 57 stores the system memory refresh time interval. Like main memory refresh timer 55, system memory refresh timer 57 generates a system refresh signal to system bus controller 56 via line 59 whenever it counts to the end of the system refresh time interval. Upon receiving the system refresh signal, system bus controller 56 activates the system memory refresh operation to system devices 61a–61n via system bus 60. System refresh timer 57 then resets the system refresh time interval and starts to count again. Therefore, system memory refresh timer 57 can also periodically generate the system refresh signal at the system refresh time interval.

The system refresh time interval can be dynamically selected. The system refresh time interval can be set to a relatively large value, or to a relatively small value. As also described above, system refresh timer 57 can also be set off. In this case, the system refresh time interval specified by system refresh timer 57 is infinity. The system refresh time interval can be adjusted to different values so as to fit different system refresh requirements. This is due to the fact that system devices 61a–61n may or may not include volatile memory. Moreover, the volatile memory or memories among system devices 61a–61n may require different refresh time intervals.

In one embodiment, system refresh timer is an 8254 timer manufactured by Intel Corporation. The system refresh time interval of system refresh timer 57 is determined and set by a system refresh time interval selection subroutine running in computer system 50, which will be described in more detail below, in conjunction with FIG. 4. The selection subroutine may be run on CPU 51 or system bus controller 56. In an alternative embodiment, the system refresh time interval is programmed by the user in system refresh timer 57. In this case, the user can manually determine the system refresh time interval and program the value in timer 57.

By having two timers 55 and 57 in computer system 50, the main memory refresh operation can be performed independently of and asynchronously with the system refresh operation. In this case, the time interval for the system memory refresh operation can be determined solely by system devices 61a–61n. If system devices 61a–61n do not include any volatile memory, and therefore do not need the periodic memory refresh operation, system refresh timer 57 can be set off or set to a relatively large value by the system refresh time interval selection subroutine or by the user. If system devices 61a–61n require the system memory refresh operation in a relatively long time interval, the system refresh time interval in refresh timer 57 can be set to the relatively long time interval. By allowing the system refresh time interval to be selective, refresh time is saved and the CPU-bus bandwidth is increased, which in turn results in the performance increase for CPU-bus activity and system master-system slave activity. All of these occur without affecting critical bus timings of computer system 50 and without requiring any hardware modification of existing computer systems.

In particular, when system devices 61a–61n do not require the system memory refresh operation at all, system refresh timer 57 is turned off. This is equivalent to setting the system refresh time interval in system refresh timer 57 to infinity. In this case, system bus controller 56 does not receive any system refresh signal and the system memory refresh operation does not occur. This increases the CPU's activity to system bus 60, as well as system master's activity to system slave. This increases the overall performance throughput of computer system 50. This increase, however, does not involve any hardware modification and does not affect critical bus timings of computer system 50.

In addition, if system devices 61a–61n require the system memory refresh operation in a relatively long time interval, the system refresh time interval selection subroutine sets the relatively long time interval to system refresh timer 57 such that the total time of the system memory refresh operation is reduced and the performance of computer system 50 is increased. As described above, the increase does not involve any existing hardware modification and does not affect critical timings of the system. In one embodiment, the relatively long time interval is 214 microseconds.

As can be understood from the above description, when system refresh timer 57 is set off, system bus controller 56 does not receive any system memory refresh signal from system refresh timer 57 and the system memory refresh operation is disabled. In this case, the time consumed by the system memory refresh operation is now saved and the performance throughput of computer system 50 is thus increased.

When system refresh timer 57 is set to the relatively long time interval, system bus controller 56 receives the system memory refresh signal at the end of this long time interval. In this case, the system memory refresh operation is triggered at a relatively low frequency which also reduces the overall time of the periodic refresh operation. This in turn also increases the system performance of computer system 50.

When the system refresh time interval selection subroutine selects a system refresh time interval, it then sets the selected time interval to system refresh timer 57. In one embodiment, under control of the system refresh time interval selection subroutine, system bus controller 56 sets the selected system refresh time interval in system refresh timer 57 via line 58. When the system memory refresh operation is not needed in system devices 61a–61n system refresh timer 57 is set off when system devices 61a–61n require the system memory refresh operation in a relatively long time interval, system bus controller 56 sets the relatively long time interval to system refresh timer 57. When a regular refresh time interval is required for the refresh of system devices 61a–61n, system bus controller 56 sets the regular refresh time interval to system refresh timer 57. System bus controller 56 is controlled by the system refresh time interval subroutine to do the time interval setting.

Figure 4:
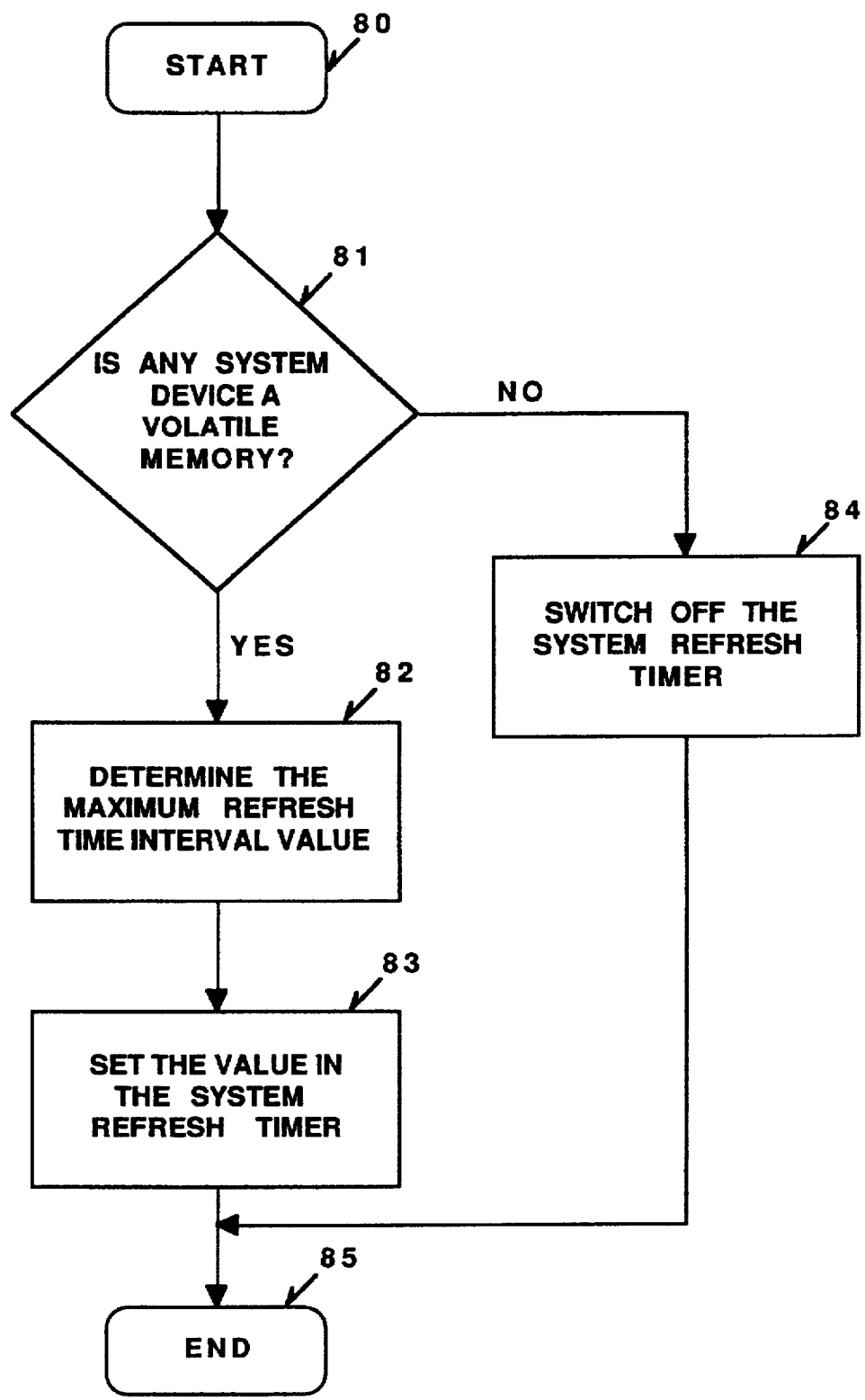
FIG. 4 is a flow chart diagram that shows the process of setting the system refresh timer of the computer system of FIG. 3.

FIG. 4 illustrates in flow chart diagram form the steps of the system refresh time interval selection subroutine described above. In FIG. 4, the subroutine starts at step 80. At step 81, a determination is made to find out if there is a volatile memory among system devices 61a–61n. If there is no volatile memory among system devices 61a–61n, which means that computer system 50 does not need any system memory refresh operation, then the subroutine goes to step 84. At step 84, system refresh timer 57 is switched off and the subroutine goes to step 85 which is the end of the subroutine. If at step 81, the subroutine, however, learns that there is at least one volatile memory, then the subroutine moves to step 82. At step 82, another determination is made to determine the maximum refresh time interval. If at this step it is determined that system devices 61a–61n do not need the system memory refresh operation for a relatively long time interval, then the determined interval value is relatively large. If at this step it is determined that system devices 61a–61n require the system memory refresh operation at a relatively short interval, then the determined interval value is relatively small. The subroutine then moves to step 83 at which the determined interval value is set to system refresh timer 57. The subroutine then ends at step 85.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for controlling a memory refresh operation in a computer system, comprising:

(A) a system bus controller, wherein a memory controller couples the system bus controller to a processor and a host volatile memory, wherein a system bus couples the system bus controller to a plurality of devices, wherein the system bus controller performs the memory refresh operation for the plurality of devices upon receiving a memory refresh signal; and (B) a timer coupled to provide the memory refresh signal to the system bus controller at a selective time interval, wherein the selective time interval is set to a first value if a required refresh interval of the plurality of devices is a first time interval, wherein the selective time interval is set to a second value if the required refresh interval is a second time interval, wherein the selective time interval is set to a third value if none of the plurality of devices requires the memory refresh operation, wherein the third value substantially eliminates subsequent memory refresh operations.

2. The apparatus of claim 1 wherein the processor executes a program to determine if any of the plurality of devices includes a device volatile memory, wherein the processor determines the required refresh interval of the device volatile memory, wherein the processor sets the selective time interval in accordance with the required refresh interval.

3. The apparatus of claim 1 wherein the system bus controller executes a program to determine if any of the plurality of device includes a device volatile memory, wherein the system bus controller determines the required refresh interval of the device volatile memory, wherein the system bus controller sets the selective time interval in accordance with the required refresh interval.

4. The apparatus of claim 1 wherein at least one of the plurality of devices includes a device volatile memory, wherein the device volatile memory is a random access memory.

5. The apparatus of claim 1 wherein at least one of the plurality of devices includes a device volatile memory, wherein one of the first and second values is selected to be a maximum time interval allowed for refreshing the device volatile memory.

6. The apparatus of claim 1 wherein the first value is approximately 15 microseconds.

7. The apparatus of claim 1 wherein the second value is approximately 214 microseconds.

8. A computer system, comprising:

a processor;

a host volatile memory;

a memory controller coupled to the host volatile memory and the processor, wherein the memory controller controls a host memory refresh operation for the host volatile memory;

a system bus controller coupled to the memory controller;

a plurality of devices coupled to the system bus controller, the system bus controller controlling a system memory refresh operation of the plurality of devices upon receiving a memory refresh signal, the system memory refresh operation being independent of the host memory refresh operation;

a timer coupled to provide the memory refresh signal to the system bus controller at a selective time interval, wherein the selective time interval is set to a first value if a required refresh interval of the plurality of devices is a first time interval, wherein the selective time interval is set to a second value if the required refresh interval is a second time interval, wherein the selective time interval is set to a third value if none of the plurality of devices requires the memory refresh operation, wherein the third value substantially eliminates subsequent memory refresh operations.

9. The apparatus of claim 8 wherein the processor executes a program to determine if any of the plurality of device includes a system volatile memory, wherein the processor determines the required refresh interval of the system volatile memory, wherein the processor sets the selective time interval.

10. The apparatus of claim 8 wherein the system bus controller executes a program to determine if any of the plurality of device includes a system volatile memory, wherein the system bus controller determines the required refresh interval of the system volatile memory, wherein the system bus controller sets the selective time interval.

11. The apparatus of claim 8 wherein the system volatile memory is a random access memory.

12. The apparatus of claim 8 wherein each of the first and second values is selected to be a maximum time interval allowed for refreshing the system volatile memory without losing any data.

13. The apparatus of claim 8 wherein the first value is approximately 15 microseconds.

14. The apparatus of claim 8 wherein the second value is approximately 214 microseconds.

15. A method of providing a memory refresh signal, comprising the steps of:

a) detecting if any of a plurality of devices coupled to a system bus controller includes a device volatile memory;

b) determining a required refresh interval of the device volatile memory;

c) selecting a first interval for the memory refresh signal, if the required refresh interval is a first predetermined interval;

d) selecting a second interval for the memory refresh signal, if the required refresh interval is a second predetermined interval;

e) selecting a third interval for the memory refresh signal, if no memory refresh signal is required wherein the third interval is chosen to substantially eliminate subsequent memory refresh signals.

16. The method of claim 15 wherein a processor executes a program to perform the steps.

17. The method of claim 15 wherein a system bus controller executes a program to perform the steps.

18. The method of claim 15 wherein the device volatile memory is a random access memory.

19. The method of claim 15 wherein the first interval is approximately 15 microseconds.

20. The method of claim 15 wherein the second interval is approximately 214 microseconds.

* * * * *

UNITED STATES PATENT AND TRADEMARK OFFICE
CERTIFICATE OF CORRECTION

PATENT NO. : 5,638,529
DATED : June 10, 1997
INVENTOR(S) : Yee et al.

It is certified that error appears in the above-identified patent and that said Letters Patent is hereby corrected as shown below:

In column 1 at line 29 delete "charging" and insert --changing--

In column 1 at line 45 delete "fine" and insert --line--

Signed and Sealed this

Ninth Day of September, 1997

*Attest:*

BRUCE LEHMAN

*Attesting Officer*  *Commissioner of Patents and Trademarks*